(12) United States Patent
Kim

(10) Patent No.: US 10,868,986 B2
(45) Date of Patent: *Dec. 15, 2020

(54) ELECTRONIC DEVICE FOR GENERATING A BOOSTED SIGNAL BY USING SIGNALS WITH NORMAL ACTIVATION LEVELS INSTEAD OF A SUPPLY VOLTAGE

(71) Applicant: SK hynix Inc., Gyeonggi-do (KR)

(72) Inventor: Tae-Gyu Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 90 days.

This patent is subject to a terminal disclaimer.

(21) Appl. No.: 16/190,710

(22) Filed: Nov. 14, 2018

(65) Prior Publication Data
US 2019/0306445 A1    Oct. 3, 2019

(30) Foreign Application Priority Data
Mar. 29, 2018    (KR) .......................... 10-2018-0036860

(51) Int. Cl.
*H04N 5/369*    (2011.01)
*H03K 17/687*    (2006.01)
(52) U.S. Cl.
CPC ......... *H04N 5/369* (2013.01); *H03K 17/6872* (2013.01)

(58) Field of Classification Search
CPC .... H04N 5/3745; H04N 5/3698; H04N 5/374; H04N 5/369; H04N 5/376; H04N 5/335; H04N 5/3651; H01L 27/14614; H03K 17/6872
USPC .......................................... 250/208.1, 214 R
See application file for complete search history.

(56) References Cited

U.S. PATENT DOCUMENTS 9,883,130 B2 *   1/2018  Guidash ............... H04N 5/3765
2019/0306446 A1 *  10/2019  Kim ...................... H04N 5/376

FOREIGN PATENT DOCUMENTS

KR           101333749          11/2013

* cited by examiner

*Primary Examiner* — Que Tan Le
(74) *Attorney, Agent, or Firm* — IP & T Group LLP

(57) ABSTRACT

An electronic device includes a first driver suitable for driving an output node with a first voltage based on an activation control signal for a first driving period, a second driver suitable for driving the output node with a second voltage based on a deactivation control signal for a second driving period, a first booster suitable for boosting voltage of the output node based on an output boost signal for a first boost period, a third driver suitable for driving a control node with a second blocking control signal based on a first blocking control signal for a third driving period, and a blocker suitable for selectively blocking between the first driver and the output node based on a control voltage applied to the control node.

13 Claims, 3 Drawing Sheets

ELECTRONIC DEVICE FOR GENERATING A BOOSTED SIGNAL BY USING SIGNALS WITH NORMAL ACTIVATION LEVELS INSTEAD OF A SUPPLY VOLTAGE

CROSS-REFERENCE TO RELATED APPLICATION

This application claims priority under 35 U.S.C. § 119 to Korean Patent Application No. 10-2018-0036860, filed on Mar. 29, 2018, in the Korean Intellectual Property Office, the disclosure of which is incorporated herein by reference in its entirety.

BACKGROUND

1. Field

Embodiments of the present invention relate to a semiconductor design technique, and more particularly, to an electronic device capable of generating a boosted signal.

2. Description of the Related Art

Electronic devices may generate and use an internally boosted signal to improve operational reliability. For example, image sensing devices use a boosted signal when transferring a charge accumulated in a photodiode to a floating diffusion node, or use the boosted signal when resetting the floating diffusion node with a source voltage.

Image sensing devices capture images using photosensitive properties of semiconductors. Image sensing devices are often classified into charge-coupled device (CCD) image sensors and complementary metal-oxide semiconductor (CMOS) image sensors. CMOS image sensors allow both analog and digital control circuits to be integrated in a single integrated circuit (IC), making CMOS image sensors the most widely used type of image sensor.

SUMMARY

Various embodiments of the present invention are directed to an electronic device capable of generating a boosted signal based on signals having a normal activation level rather than a boosted voltage.

In accordance with an embodiment of the present invention, an electronic device includes: a first driver suitable for driving an output node with a first voltage based on an activation control signal for a first driving period; a second driver suitable for driving the output node with a second voltage based on a deactivation control signal for a second driving period; a first booster suitable for boosting voltage of the output node based on an output boost signal for a first boost period; a third driver suitable for driving a control node with a second blocking control signal based on a first blocking control signal for a third driving period; and a blocker suitable for selectively blocking between the first driver and the output node based on a control voltage applied to the control node.

The blocker may block between the first driver and the output node for a blocking period including the first boost period.

The blocker may include a plurality of switching elements coupled in series to each other.

The electronic device may further include: a second booster suitable for boosting voltage of the control node based on a blocking boost signal for a second boost period.

The second boost period may include the first boost period.

The first booster may include a capacitor, capacitance of which is set in consideration of parasitic capacitance of a load coupled to the output node.

In accordance with an embodiment of the present invention, an electronic device includes: a pixel array suitable for generating pixel signals based on a reset control signal, a transmission control signal and a selection control signal; and a controller suitable for generating any one of the reset control signal, the transmission control signal and the selection control signal based on a supply voltage, and generating remaining signals among the reset control signal, the transmission control signal and the selection control signal based on various signals generated for a set period, wherein each of the various signals has a first activation level, wherein the remaining signals have a second activation level that is greater than the first activation level.

The various signals may include an activation control signal, a deactivation control signal, an output boost signal, first and second blocking control signals, and a blocking boost signal, and wherein the controller may include: a first driver suitable for driving an output node with a first voltage based on the activation control signal for a first driving period, where the remaining signals are generated from the output node; a second driver suitable for driving the output node with a second voltage based on a deactivation control signal for a second driving period; a first booster suitable for boosting voltage of the output node based on the output boost signal for a first boost period; a third driver suitable for driving a control node with the second blocking control signal based on the first blocking control signal for a third driving period; a second booster suitable for boosting voltage of the control node based on the blocking boost signal for a second boost period; and a blocker suitable for selectively blocking between the first driver and the output node based on a control voltage applied to the control node.

The blocker may block between the first driver and the output node for a blocking period including the first boost period.

The blocker may include a plurality of switching elements coupled in series to each other.

The second boost period may include the first boost period.

The first booster may include a capacitor, capacitance of which is set in consideration of parasitic capacitance of the pixel array coupled to the output node.

In accordance with an embodiment of the present invention, an electronic device includes: a control node; an output node suitable for outputting an output signal; a pull-up driver suitable for driving the output node with a source voltage based on an activation control signal for a first driving period; a pull-down driver suitable for driving the output node with a ground voltage based on a deactivation control signal for a second driving period; an output booster suitable for boosting voltage of the output node based on an output boost signal for a first boost period; a blocker suitable for selectively blocking between the pull-up driver and the output node based on a control voltage applied to the control node; an additional booster suitable for boosting voltage of the control node based on a blocking boost signal for a second boost period; and an additional driver suitable for driving the control node with a second blocking control signal based on a first blocking control signal for a third driving period, wherein the second boost period follows the first driving period, and the second driving period follows the second boost period, wherein the second boost period includes the first boost period, and wherein the output signal in the first boost period has a voltage level greater than the source voltage.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. That said, reference to "an embodiment" or the like is not necessarily to only one embodiment, and different references to any such phrase are not necessarily to the same embodiment(s). The embodiments presented are merely examples and are not intended to limit the scope of the invention.

Moreover, it is noted that the terminology used herein is for the purpose of describing the embodiments and is not intended to be limiting of the invention. As used herein, singular forms are intended to include the plural forms and vice versa, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through one or more intermediate components.

It will be understood that, although the terms "first", "second", "third", and so on may be used herein to identify various elements, these elements are not limited by these terms. These terms are used to distinguish one element from another element that otherwise have the same or similar names. Thus, a first element described below could also be termed as a second or third element without departing from the spirit and scope of the present invention.

The drawings are not necessarily to scale and, in some instances, proportions may have been exaggerated in order to clearly illustrate features of the embodiments.

Figure 1:
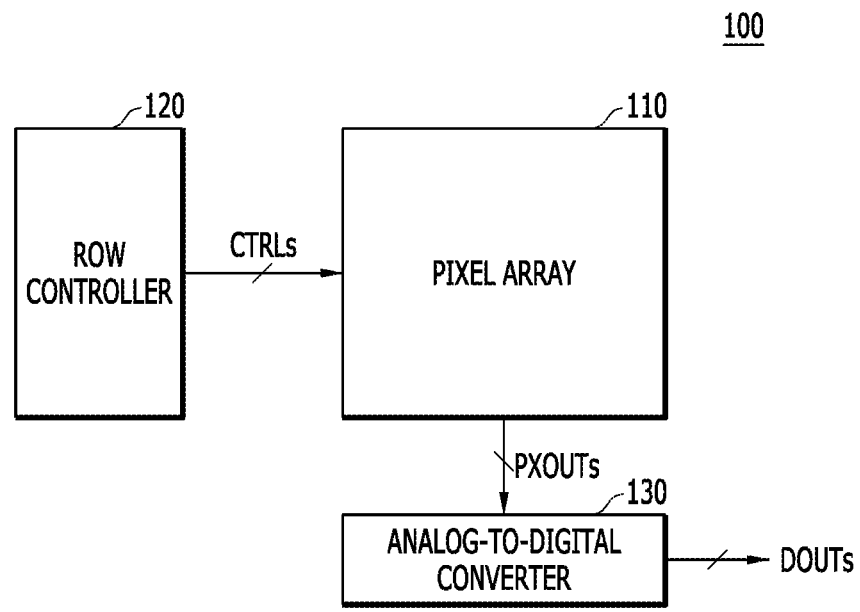
FIG. 1 is a block diagram illustrating an electronic device in accordance with an embodiment of the present invention.

FIG. 1 is a block diagram illustrating an electronic device 100 in accordance with an embodiment of the present invention.

Referring to FIG. 1, the electronic device 100 may include a pixel array 110, a row controller 120, and an analog-to-digital converter 130.

The pixel array 110 may generate pixel signals PXOUTs in units of rows based on row control signals CTRLs. Although not illustrated, the pixel array 110 may include a plurality of pixels arranged in row and column directions.

The row controller 120 may generate the row control signals CTRLs for controlling the pixel array 110 in units of rows. The row control signals CTRLs may include control signals which are allocated for each row of the pixel array 110. The control signals may include a reset control signal RX, a transmission control signal TX, and a selection control signal SX, which are to be described below. For example, the row controller 120 generates any one of the reset control signal RX, the transmission control signal TX and the selection control signal SX based on a supply voltage (not illustrated). Further, the row controller 120 generates remaining control signals based on various signals (e.g., VA, VB, SA, SB, SC and SD shown in FIG. 3) which are generated for a set or predetermined period instead of the supply voltage. The remaining control signals are boosted signals, which have activation levels higher or greater than activation levels of the signals VA, VB, SA, SB, SC and SD. The supply voltage may be an external voltage that is continuously supplied from an outside of the electronic device 100, or an internal voltage that is generated and supplied within the electronic device 100.

The analog-to-digital converter 130 may convert the pixel signals PXOUTs into digital signals DOUTs.

Figure 2:
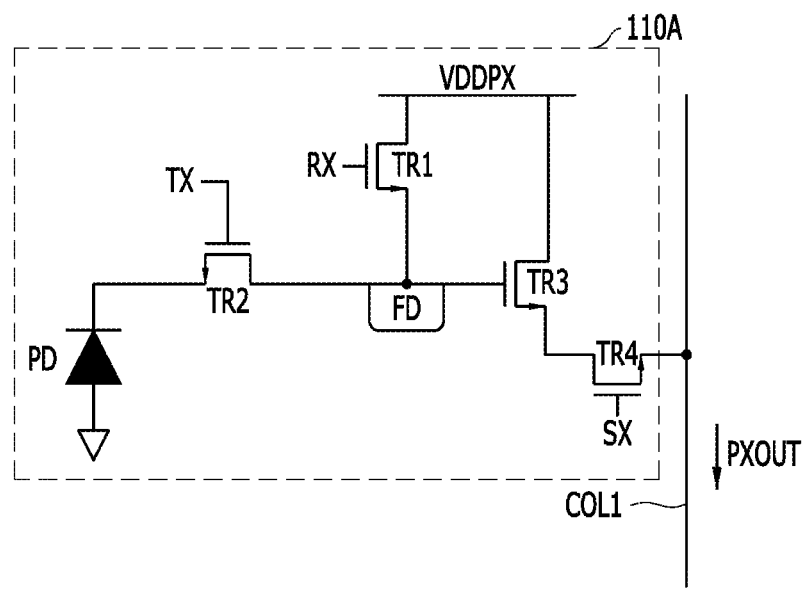
FIG. 2 is a circuit diagram illustrating a pixel of a pixel array in accordance with an embodiment of the present invention.

FIG. 2 is a circuit diagram illustrating a pixel in accordance with an embodiment of the present invention, for example, a pixel of the pixel array 110 shown in FIG. 1. For clarity, FIG. 2 representatively illustrates one pixel of the plurality of pixels included in the pixel array 110.

Referring to FIG. 2, the pixel 110A may include a photodiode PD, a floating diffusion node FD, a reset element TR1, a transmission element TR2, a driving element TR3, and a selection element TR4. Elements TR1, TR2, TR3, and TR4 may be transistors.

The photodiode PD may generate a photocharge based on incident light for an exposure period.

The floating diffusion node FD may accumulate the photocharge. A parasitic capacitor (not illustrated) may be coupled to the floating diffusion node FD. The parasitic capacitor accumulates the photocharge.

The reset element TR1 may reset the floating diffusion node FD with a source voltage VDDPX based on the reset control signal RX. For example, the reset element TR1 includes an NMOS transistor having a gate receiving the reset control signal RX, a drain coupled to a voltage terminal for a source voltage VDDPX and a source coupled to the floating diffusion node FD.

The transmission element TR2 may transmit the photocharge to the floating diffusion node FD based on the transmission control signal TX. For example, the transmission element TR2 includes an NMOS transistor having a gate receiving the transmission control signal TX, a drain coupled to the floating diffusion node FD and a source coupled to the photodiode PD.

The driving element TR3 may drive one side of the selection element TR4 with the source voltage VDDPX based on a voltage loaded onto the floating diffusion node FD. For example, the driving element TR3 includes an NMOS transistor having a gate coupled to the floating diffusion node FD, a drain coupled to the voltage terminal for the source voltage VDDPX and a source coupled to the selection element TR4.

The selection element TR4 may output the pixel signal PXOUT to the analog-to-digital converter 130 of FIG. 1 through a column line COL1 based on the selection control signals SX. For example, the selection element TR4 includes an NMOS transistor having a gate receiving the selection control signal SX, a drain coupled to the driving element TR3 and a source coupled to the column line COL1.

Figure 3:
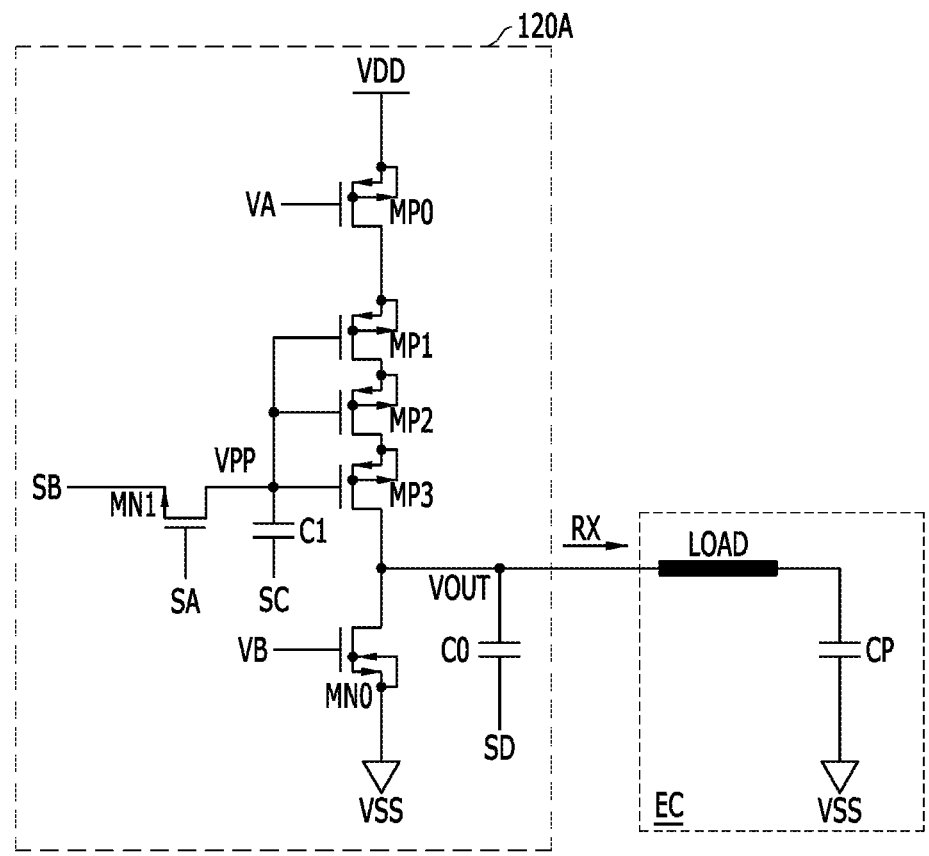
FIG. 3 is a circuit diagram illustrating a circuit of a row controller in accordance with an embodiment of the present invention.

FIG. 3 is a circuit diagram illustrating a row controller in accordance with an embodiment of the present invention, for example, a portion of the row controller 120 shown in FIG. 1. For clarity, FIG. 3 illustrates a circuit for generating the reset control signal RX included in the row controller 120. FIG. 3 illustrates an equivalent circuit EC of pixels arranged in a single row, where the pixels receive the reset control signal RX.

Referring to FIG. 3, the circuit 120A may include a pull-up driver MP0, a pull-down driver MN0, an output booster C0, a blocking driver MN1, a blocking booster C1, and blocker MP1, MP2 and MP3.

The pull-up driver MP0 may drive an output node VOUT with a power source voltage VDD based on an activation control signal VA for a pull-up driving period. The pull-up driver MP0 may drive the output node VOUT through the blocker MP1, MP2 and MP3. For example, the pull-up driver MP0 includes a PMOS transistor coupled between a supply voltage terminal of the power source voltage VDD and one side of the blocker MP1, MP2 and MP3. MP0 has a gate receiving the activation control signal VA.

The pull-down driver MN0 may drive the output node VOUT with a ground voltage VSS based on a deactivation control signal VB for a pull-down driving period. For example, the pull-down driver MN0 includes an NMOS transistor coupled between the output node VOUT and a ground terminal of the ground voltage VSS. MN0 has a gate receiving the deactivation control signal VB.

The output booster C0 may boost the output node VOUT based on an output boost signal SD for an output boost period. For example, the output booster C0 includes a capacitor coupled between the output node VOUT and an input node of the output boost signal SD. Capacitance of the capacitor included in the output booster C0 may be set in consideration of parasitic capacitance CP of the equivalent circuit EC coupled to the output node VOUT.

The blocking driver MN1 may drive a control node VPP with a second blocking control signal SB based on a first blocking control signal SA for a blocking preparation period. For example, the blocking driver MN1 includes an NMOS transistor coupled between the control node VPP and an input node of the second blocking control signal SB. MN1 has a gate receiving the first blocking control signal SA.

The blocking booster C1 may boost the control node VPP based on a blocking boost signal SC for a blocking boost period. For example, the blocking booster C1 includes a capacitor coupled between the control node VPP and an input node of the blocking boost signal SC.

The blocker MP1, MP2 and MP3 may selectively block between the pull-up driver MP0 and the output node VOUT based on a control voltage applied to the control node VPP. For example, the blocker MP1, MP2 and MP3 may include first to third switching elements coupled in series between the pull-up driver MP0 and the output node VOUT. Each of the first to third switching elements may have a PMOS transistor. Although it is shown that three switching elements are included, the present invention is not limited to this arrangement. Depending on a voltage level of the power source voltage VDD and a target voltage level of the reset control signal RX, one or more switching elements may be included.

An operation of the electronic device 100 having the above-described structure in accordance with an embodiment of the present invention is described with reference to FIGS. 4 and 5.

Figure 4:
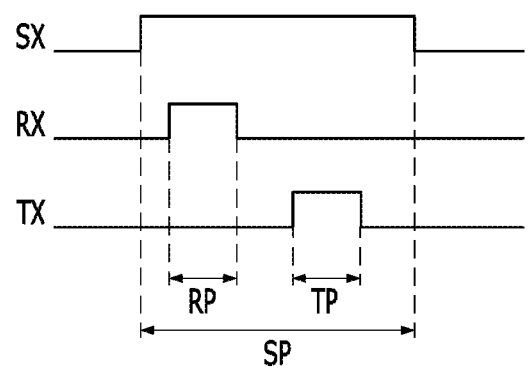
FIG. 4 is a timing diagram illustrating an operation of an electronic device in accordance with an embodiment of the present invention.

FIG. 4 is a timing diagram illustrating an operation of an electronic device in accordance with an embodiment of the present invention, for example, the electronic device 100 shown in FIG. 1. For clarity, FIG. 4 illustrates a timing diagram of a process of controlling pixels arranged in a single row among the pixels included in the pixel array 110.

Referring to FIG. 4, the row controller 120 may generate the reset control signal RX, the transmission control signal TX and the selection control signal SX for a single row time period. For example, the row controller 120 activates the selection control signal SX is activated to a logic high level for the single row time period, activates the reset control signal RX to a logic high level for a reset period, and subsequently activates the transmission control signal TX to a logic high level for a transmission period.

The pixels arranged in the single row may simultaneously generate the pixel signals PXOUTs based on the reset control signal RX, the transmission control signal TX and the selection control signal SX. An operation of one of the pixels arranged in the single row is representatively described in detail. Referring also to FIG. 2, the selection element TR4 may couple the driving element TR3 to the column line COL1 based on the selection control signal SX. The reset element TR1 may reset the floating diffusion node FD with the source voltage VDDPX based on the reset control signal RX for the reset period. The driving element TR3 may generate a reset signal corresponding to the voltage loaded onto the floating diffusion node FD for the reset period. The selection element TR4 may output the reset signal as the pixel signal PXOUT to the analog-to-digital converter 130 through the column line COL1. Continuously, the transmission element TR2 may transmit the photocharge to the floating diffusion node FD based on the transmission control signal TX for the transmission period. The driving element TR3 may generate a data signal corresponding to the voltage loaded onto the floating diffusion node FD for the transmission period. The selection element TR4 may output the data signal as the pixel signal PXOUT to the analog-to-digital converter 130 through the column line COL1.

Figure 5:
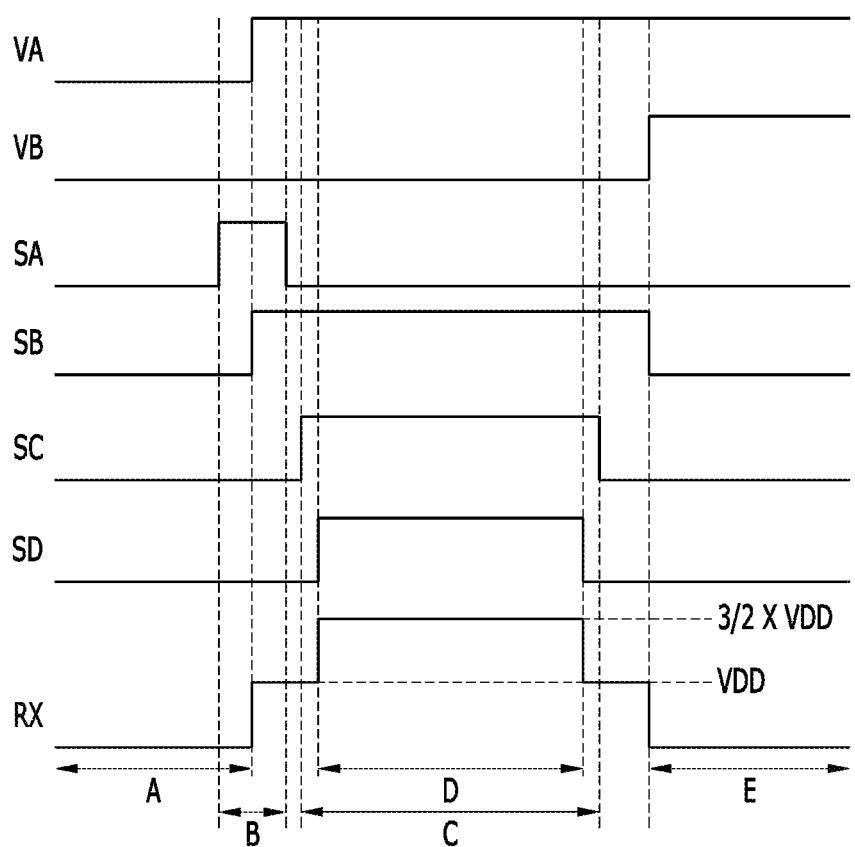
FIG. 5 is a timing diagram illustrating a generation process of a reset control signal in accordance with an embodiment of the present invention.

FIG. 5 is a timing diagram illustrating a generation process of a reset control signal in accordance with an embodiment of the present invention, for example, a generation process of the reset control signal RX shown in FIG. 4.

Referring to FIG. 5, the activation control signal VA may be activated to a logic low level for an activation control period (that is, a first driving period) A. The pull-up driver MP0 of FIG. 3 may drive the output node VOUT with the power source voltage VDD for the activation control period A. The pull-up driver MP0 may drive the output node VOUT with the power source voltage VDD for an overlapping period of the activation control period A and a blocking preparation period (that is, a third driving period) B. In other words, for a period where the blocker MP1, MP2 and MP3 do not block between the pull-up driver MP0 and the output node VOUT during the activation control period A, that is, the overlapping period, the pull-up driver MP0 may drive the output node VOUT with the power source voltage VDD. The output node VOUT may be charged with a power source voltage VDD level by the output booster C0.

For the blocking preparation period B, the first and second blocking control signals SA and SB may be sequentially activated to a logic high level. As the first blocking control signal SA is activated, the block and element MN1 may drive the control node VPP with a deactivation level (that is, VSS) of the second blocking control signal SB for an initial period of the blocking preparation period B. Accordingly, for the initial period, the first to third switching elements included in the blocker MP1, MP2 and MP3 may be turned on. As the second blocking control signal SB is activated, the blocking driver MN1 may drive the control node VPP with an activation level (that is, VDD) of the second blocking control signal SB for a last period of the blocking preparation period B. Accordingly, for the last period, the first to third switching elements in the blocker MP1, MP2 and MP3 maybe turned off. The control node VPP may be charged with the activation level, that is, VDD of the second blocking control signal SB by the blocking booster C1.

For a blocking boost period (that is, a second boost period) C, the blocking boost signal SC may be activated to a logic high level. The blocking booster C1 may boost the control node VPP as much as an activation level (that is, VDD) of the blocking boost signal SC for the blocking boost period C. The control node VPP may have a voltage level {2×VDD} obtained by adding the activation level (that is, VDD) of the second blocking control signal SB and the activation level (that is, VDD) of the blocking boost signal SC. Accordingly, the first to third switching elements in the blocker MP1, MP2 and MP3 may be fully turned off.

For an output boost period (that is, a first boost period) D, the output boost signal SD may be activated to a logic high level. The output booster C0 may boost the output node VOUT as much as an activation level (that is, VDD) of the output boost signal SD for the output boost period D. The output node VOUT may have a voltage level {2×DD} obtained by adding the power source voltage VDD level which is previously charged and the activation level (that is, VDD) of the output boost signal SD. However, since the parasitic capacitor CP of the pixel array 110 has to be considered, in actuality, the output node VOUT may have a smaller voltage level than the voltage level {2×VDD} obtained by adding the power source voltage VDD level and the activation level (that is, VDD) of the output boost signal SD. For example, when capacitance of the output booster C0 and capacitance of the parasitic capacitor CP is the same, the output node VOUT may have a voltage level {3/2×VDD} obtained by adding the power source voltage VDD level and a half of the voltage level {1/2×VDD} which refers to a half of the activation level of the output boost signal SD.

Although the pull-up driver MP0 and the blocker MP1, MP2 and MP3 are turned off for the output boost period D, each of the pull-up driver MP0 and the blocker MP1, MP2 and MP3 may operate as a parasitic diode. However, due to a threshold voltage of the pull-up driver MP0 and threshold values of the first to third switching elements included in the blocker MP1, MP2 and MP3, a leakage current path may not be formed in a direction of the supply voltage terminal of the power source voltage VDD from the output node VOUT. In other words, when a sum of the power source voltage VDD and the threshold voltages of the pull-up driver MP0 and first to third switching elements are greater than the target voltage level (that is, 3/2×VDD) of the reset control signal RX, the leakage current path may not be formed. For this reason, for the output boost period D, the reset control signal RX generated from the output node VOUT may have the target voltage level {3/2×VDD}.

For a deactivation control period (that is, a second driving period) E, the deactivation control signal VB may be activated to a logic high level. Accordingly, the pull-down driver MN0 may drive the output node VOUT with the ground voltage VSS for the deactivation control period E.

As is apparent from embodiments of the present disclosure, advantages are provided in that a boosted signal may be generated based on various signals having normal activation levels instead of a supply voltage.

Since it is possible to generate a boosted signal only using a simple circuit without a voltage generator, for example, a direct current (DC) to DC (DC-DC) converter, for generating a boost voltage, an occupying area of an electronic device may be reduced, and operational reliability of the electronic device may be improved.

While the present invention has been described with respect to specific embodiments, these embodiments are not intended to be restrictive, but rather descriptive. Further, it is noted that the present invention may be implemented in various ways through substitution, change, and modification of any of the disclosed embodiments by those skilled in the art without departing from the spirit and/or scope of the present invention as defined by the following claims.

What is claimed is:

1. An electronic device, comprising:
    a first driver suitable for driving an output node with a first voltage based on an activation control signal for a first driving period;
    a second driver suitable for driving the output node with a second voltage based on a deactivation control signal for a second driving period;
    a first booster suitable for boosting voltage of the output node based on an output boost signal for a first boost period;
    a third driver suitable for driving a control node with a second blocking control signal based on a first blocking control signal for a third driving period; and
    a blocker suitable for selectively blocking between the first driver and the output node based on a control voltage applied to the control node.

2. The electronic device of claim 1, wherein the blocker blocks between the first driver and the output node for a blocking period including the first boost period.

3. The electronic device of claim 1, wherein the blocker includes a plurality of switching elements coupled in series to each other.

4. The electronic device of claim 1, further comprising:
    a second booster suitable for boosting voltage of the control node based on a blocking boost signal for a second boost period.

5. The electronic device of claim 4, wherein the second boost period includes the first boost period.

6. The electronic device of claim 1, wherein the first booster includes a capacitor, capacitance of which is set in consideration of parasitic capacitance of a load coupled to the output node.

7. An electronic device, comprising:
    a pixel array suitable for generating pixel signals based on a reset control signal, a transmission control signal and a selection control signal; and
    a controller suitable for generating any one of the reset control signal, the transmission control signal and the selection control signal based on a supply voltage, and generating remaining signals among the reset control signal, the transmission control signal and the selection control signal based on various signals generated for a set period,
    wherein each of the various signals has a first activation level, wherein the remaining signals have a second activation level that is greater than the first activation level.

8. The electronic device of claim 7, wherein the various signals include an activation control signal, a deactivation control signal, an output boost signal, first and second blocking control signals, and a blocking boost signal, and wherein the controller includes:
   a first driver suitable for driving an output node with a first voltage based on the activation control signal for a first driving period, where the remaining signals are generated from the output node;
   a second driver suitable for driving the output node with a second voltage based on a deactivation control signal for a second driving period;
   a first booster suitable for boosting voltage of the output node based on the output boost signal for a first boost period;
   a third driver suitable for driving a control node with the second blocking control signal based on the first blocking control signal for a third driving period;
   a second booster suitable for boosting voltage of the control node based on the blocking boost signal for a second boost period; and
   a blocker suitable for selectively blocking between the first driver and the output node based on a control voltage applied to the control node.

9. The electronic device of claim 8, wherein the blocker blocks between the first driver and the output node for a blocking period including the first boost period.

10. The electronic device of claim 8, wherein the blocker includes a plurality of switching elements coupled in series to each other.

11. The electronic device of claim 8, wherein the second boost period includes the first boost period.

12. The electronic device of claim 8, wherein the first booster includes a capacitor, capacitance of which is set in consideration of parasitic capacitance of the pixel array coupled to the output node.

13. An electronic circuit, comprising:
   a control node;
   an output node suitable for outputting an output signal;
   a pull-up driver suitable for driving the output node with a source voltage based on an activation control signal for a first driving period;
   a pull-down driver suitable for driving the output node with a ground voltage based on a deactivation control signal for a second driving period;
   an output booster suitable for boosting voltage of the output node based on an output boost signal for a first boost period;
   a blocker suitable for selectively blocking between the pull-up driver and the output node based on a control voltage applied to the control node;
   an blocking booster suitable for boosting voltage of the control node based on a blocking boost signal for a second boost period; and
   an blocking driver suitable for driving the control node with a second blocking control signal based on a first blocking control signal for a third driving period,
   wherein the second boost period follows the first driving period, and the second driving period follows the second boost period,
   wherein the second boost period includes the first boost period, and
   wherein the output signal in the first boost period has a voltage level greater than the source voltage.

* * * * *